United States Patent
Yu et al.

(10) Patent No.: US 12,135,359 B2
(45) Date of Patent: Nov. 5, 2024

(54) OPEN-CIRCUIT FAULT DETECTION METHOD AND APPARATUS, AND COMPUTER DEVICE

(71) Applicant: EAST GROUP CO., LTD., Guangdong (CN)

(72) Inventors: Wei Yu, Guangdong (CN); Jin Zhao, Guangdong (CN); Shaohui Li, Guangdong (CN)

(73) Assignee: EAST GROUP CO., LTD., Dongguan (CN)

( * ) Notice: Subject to any disclaimer, the term of this patent is extended or adjusted under 35 U.S.C. 154(b) by 0 days.

(21) Appl. No.: 17/760,223

(22) PCT Filed: Oct. 14, 2021

(86) PCT No.: PCT/CN2021/123770
§ 371 (c)(1),
(2) Date: Aug. 5, 2022

(87) PCT Pub. No.: WO2022/156274
PCT Pub. Date: Jul. 28, 2022

(65) Prior Publication Data
US 2023/0071191 A1 Mar. 9, 2023

(30) Foreign Application Priority Data
Jan. 19, 2021 (CN) .......................... 202110070833.5

(51) Int. Cl.
*H02M 3/00* (2006.01)
*G01R 23/16* (2006.01)
(Continued)

(52) U.S. Cl.
CPC ............. *G01R 31/54* (2020.01); *G01R 23/16* (2013.01); *G01R 31/40* (2013.01);
(Continued)

(58) Field of Classification Search
CPC ............... H02M 3/01; H02M 3/33584; H02M 3/33573; H02M 1/32; G01R 23/16;
(Continued)

(56) References Cited

U.S. PATENT DOCUMENTS 11,002,802 B2 * 5/2021 Wang .................... G01R 31/72
2019/0242936 A1  8/2019 He et al.
(Continued)

FOREIGN PATENT DOCUMENTS

CA       2814326 A1    10/2013
CN     101458280 A     6/2009
(Continued)

*Primary Examiner* — Alexander Satanovsky
*Assistant Examiner* — Trung Q Nguyen
(74) *Attorney, Agent, or Firm* — SHIMOKAJI IP (57) ABSTRACT

A method, an apparatus and a computer device for detecting an open circuit fault are provided. The sample data of the electrical signal at the primary side of the transformer in the CLLLC resonant bidirectional DC/DC converter is performed with spectrum analysis to obtain a first frequency, and whether an open circuit fault occurs in the CLLLC resonant bidirectional DC/DC converter can be determined according to the first frequency and an actual switching frequency.

9 Claims, 7 Drawing Sheets

(51) Int. Cl.
*G01R 31/40* (2020.01)
*G01R 31/54* (2020.01)
*H02H 7/12* (2006.01)
*H02M 3/335* (2006.01)

(52) U.S. Cl.
CPC ............ *H02H 7/1213* (2013.01); *H02M 3/01* (2021.05); *H02M 3/33584* (2013.01)

(58) Field of Classification Search
CPC ...... G01R 31/54; G01R 31/40; H02H 7/1213; Y02T 10/7072; Y02T 90/12; Y02T 10/70
USPC ............... 324/400, 430, 433, 431, 500, 600, 324/764.01, 103 R, 771, 761.01, 501, 324/639, 642, 702, 76.11, 76.66, 96
See application file for complete search history.

(56) References Cited

U.S. PATENT DOCUMENTS

| | | | |
|---|---|---|---|
| 2020/0144810 A1* | 5/2020 | Zhou | H02M 1/32 |
| 2021/0215771 A1* | 7/2021 | Wang | H02M 1/32 |
| 2021/0328443 A1* | 10/2021 | Wolgemuth | H02J 7/00308 |
| 2022/0038018 A1* | 2/2022 | Marcos Pastor | H02M 1/44 |
| 2023/0025867 A1* | 1/2023 | Woo | H02M 3/33584 |
| 2023/0318468 A1* | 10/2023 | Meghnous | B60L 53/30 320/109 |

FOREIGN PATENT DOCUMENTS

| | | |
|---|---|---|
| CN | 105093082 A | 11/2015 |
| CN | 111211694 A | 5/2020 |
| CN | 111413647 A | 7/2020 |
| CN | 112083353 A | 12/2020 |

* cited by examiner

OPEN-CIRCUIT FAULT DETECTION METHOD AND APPARATUS, AND COMPUTER DEVICE

FIELD OF THE INVENTION

The present application relates to the technical field of online detection, and in particular to a method, an apparatus and a computer device for detecting an open circuit fault in a CLLLC resonant bidirectional DC/DC converter.

BACKGROUND OF THE INVENTION

With the rapid development of new energy technology in our country, more and more new energy vehicles appear, alleviating the increasing shortage of traditional energy. As one of the important modules of the new energy vehicle charging pile, the stability of the DC/DC converter will inevitably affect the reliability of the entire system operation. CLLLC resonant bidirectional DC/DC converters have the advantages of high efficiency, high power density, bidirectional operation and soft switching, which are widely used in various scenarios therefore.

It's an important engineering application value for improving the reliability of the system to propose an effective diagnosis method for the open-circuit fault in the CLLLC resonant bidirectional DC/DC converter.

SUMMARY OF THE INVENTION

In view of the above problems, it is necessary to provide a method, an apparatus and a computer device for detecting an open circuit fault in a CLLLC resonant bidirectional DC/DC converter.

As a first aspect, an open-circuit fault detection method is provided and adapted for detecting an open-circuit fault in a CLLLC resonant bidirectional DC/DC converter, and the method includes:
  acquiring an electrical signal data set including current electrical signal data and a first amount of electrical signal data, and the electrical signal data being sample data of an electrical signal at a primary side of a transformer in the CLLLC resonant bidirectional DC/DC converter;
  performing spectrum analysis on the electrical signal data to obtain amplitude-frequency information of the electrical signal data, and regarding a frequency corresponding to a maximum amplitude in the amplitude-frequency information as a first frequency; and
  determining whether an open circuit fault occurs in the CLLLC resonant bidirectional DC/DC converter according to the first frequency and an actual switching frequency of the CLLLC resonant bidirectional DC/DC converter.

In one embodiment, said acquiring an electrical signal data set includes:
  analyzing an amount of electrical signal data in the electrical signal data set;
  obtaining an electrical signal data set consisting of the current electrical signal data and historical electrical signal data sequentially adjacent to the current electrical signal data, if the amount of the electrical signal data of the electrical signal data set is less than the first amount; and
  updating the electrical signal data in the electrical signal data set, if the amount of the electrical signal data of the electrical signal data set is equal to the first amount.

In one embodiment, said updating the electrical signal data in the electrical signal data set includes:
  deleting the electrical signal data corresponding to an earliest time in the electrical signal data set;
  sampling the electrical signal at the primary side of the CLLLC resonant bidirectional DC/DC converter at the current moment to obtain current electrical signal data; and
  adding the current electrical signal data to form an electrical signal data set.

In one embodiment, said determining whether an open circuit fault occurs in the CLLLC resonant bidirectional DC/DC converter includes:
  calculating a difference between the first frequency and the actual switching frequency; and
  determining that an open circuit fault occurs in the CLLLC resonant bidirectional DC/DC converter, once the difference is greater than a first preset threshold.

In one embodiment, the method further includes:
  calculating an upper envelope mean value of the electrical signal data of the electrical signal data set;
  calculating a lower envelope mean value of the electrical signal data of the electrical signal data set; and
  locating a faulty power tube in the CLLLC resonant bidirectional DC/DC converter according to the upper envelope mean value and the lower envelope mean value.

In one embodiment, the CLLLC resonant bidirectional DC/DC converter includes a first power unit and a second power unit, and the first power unit includes a power tube directly connected to an resonant inductor at the primary side of the CLLLC resonant bidirectional DC/DC converter, the second power unit includes a power tube directly connected to an resonant capacitor at the primary side of the CLLLC resonant bidirectional DC/DC converter;
  said locating a faulty power tube of the CLLLC resonant bidirectional DC/DC converter includes:
  determining the second power unit to be faulty, if an absolute value of the mean value of the upper envelope is greater than that of the lower envelope; and
  determining the first power unit to be faulty, if the absolute value of the mean value of the upper envelope is smaller than that of the lower envelope.

In one embodiment, said performing spectrum analysis on the electrical signal data includes performing fast Fourier transform on the electrical signal data.

In one embodiment, the first amount is positively related to a resolution of the fast Fourier transform.

As a second aspect, an open-circuit fault detection apparatus is provided and adapted for detecting an open-circuit fault in a CLLLC resonant bidirectional DC/DC converter, and the apparatus includes:
  a sampling module, configured to acquire an electrical signal data set including current electrical signal data and a first amount of electrical signal data, and the electrical signal data being sample data of an electrical signal at a primary side of a transformer in the CLLLC resonant bidirectional DC/DC converter;
  an analysis module, configured to perform spectrum analysis on the electrical signal data to obtain amplitude-frequency information of the electrical signal data, and regard a frequency corresponding to a maximum amplitude in the amplitude-frequency information as a first frequency; and
  a judging module, configured to determine whether an open circuit fault occurs in the CLLLC resonant bidirectional DC/DC converter according to the first frequency and an actual switching frequency of the CLLLC resonant bidirectional DC/DC converter.

As a third aspect, a computer device is provided and includes a memory storing computer programs and a processor, wherein the processor is configured to execute the computer programs to implement steps of the open-circuit fault detection method according to the first aspect.

As a fourth aspect, a computer-readable storage medium is provided, which stores computer programs configured to be executed by a processor to implement the steps of the open-circuit fault detection method according to the first aspect.

In the above method, apparatus and computer device, the sample data of the electrical signal at the primary side of the transformer in the CLLLC resonant bidirectional DC/DC converter is performed with spectrum analysis to obtain a first frequency, and whether an open circuit fault occurs in the CLLLC resonant bidirectional DC/DC converter can be determined according to the first frequency and an actual switching frequency.

DETAILED DESCRIPTION OF ILLUSTRATED EMBODIMENTS

In order to make the purpose, technical solutions and advantages of the present application more clearly understood, the present application will be described in further detail below with reference to the accompanying drawings and embodiments. It should be understood that the specific embodiments described herein are only used to explain the present application, but not to limit the present application.

As an important part of power electronic converters, DC/DC converters are widely used in large-capacity energy storage systems in DC power grids, electric vehicles and distributed DC power supplies, which converts the electric energy to DC according to the voltage and power demand of the load.

Bidirectional DC/DC converters are widely used in situations requiring bidirectional flow of energy because they can replace two unidirectional DC/DC converters, which can reduce the size of the device and the costs. Therefore, it's an important engineering application value for improving the reliability of the system to propose an effective diagnosis method for the open-circuit fault in the CLLLC resonant bidirectional DC/DC converter. Generally speaking, fault diagnosis methods can be divided into three types: fault diagnosis method based on analytical model, signal processing, and knowledge. Specifically, the fault diagnosis method based on analytical model requires a clear mathematical model, and the robustness of such a method is increasingly prominent due to modeling errors, disturbances and other factors; the fault diagnosis method based on signal processing is mainly aimed at the system in which the analytical model of the system is difficult to obtain, but some state quantities can be measured; the fault diagnosis method based on knowledge is suitable for nonlinear systems which do not require mathematical models.

Figure 1:
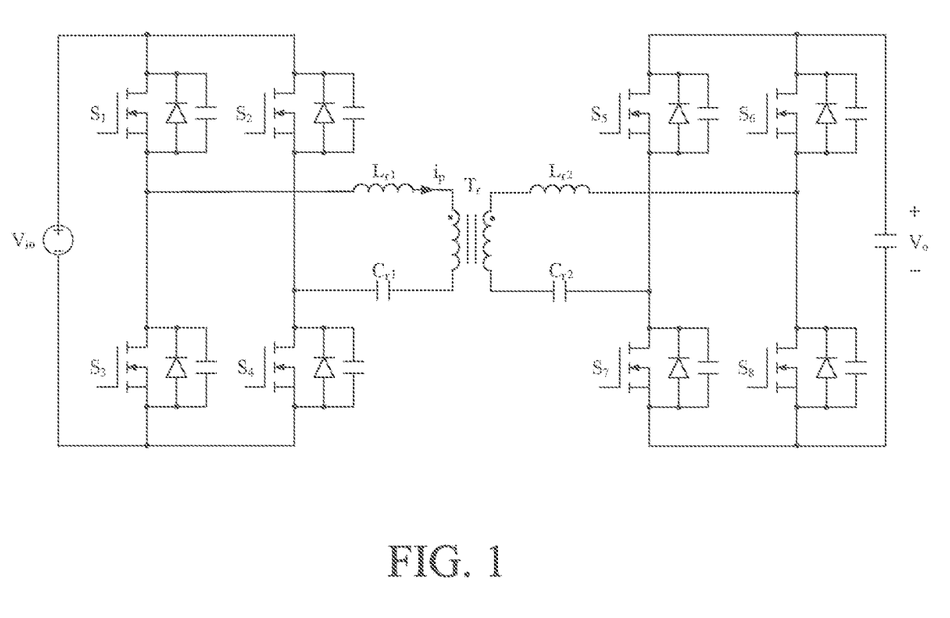
FIG. 1 is a topology diagram of a CLLLC resonant bidirectional DC/DC converter.

FIG. 1 shows a topology diagram of a CLLLC resonant bidirectional DC/DC converter. As illustrated, the CLLLC resonant bidirectional DC/DC converter includes a power supply $V_{in}$, a load $V_o$, four primary side power tubes (power tube $S_1$, power tube $S_2$, power tube $S_3$ and power tube $S_4$), four secondary side power tubes (power tube $S_5$, power tube $S_6$, power tube $S_7$ and power tube $S_8$), a primary side resonant inductor $L_{r1}$, a secondary side resonant inductor $L_{r2}$, a primary side resonant capacitor $C_{r1}$, a secondary side resonant capacitor $C_{r2}$ and a transformer $T_r$.

In the following embodiment, the CLLLC resonant bidirectional DC/DC converter shown in FIG. 1 is taken as an example to describe the method and the apparatus, the computer device and the computer storage medium of detecting an open circuit fault, in detail.

Figure 2:
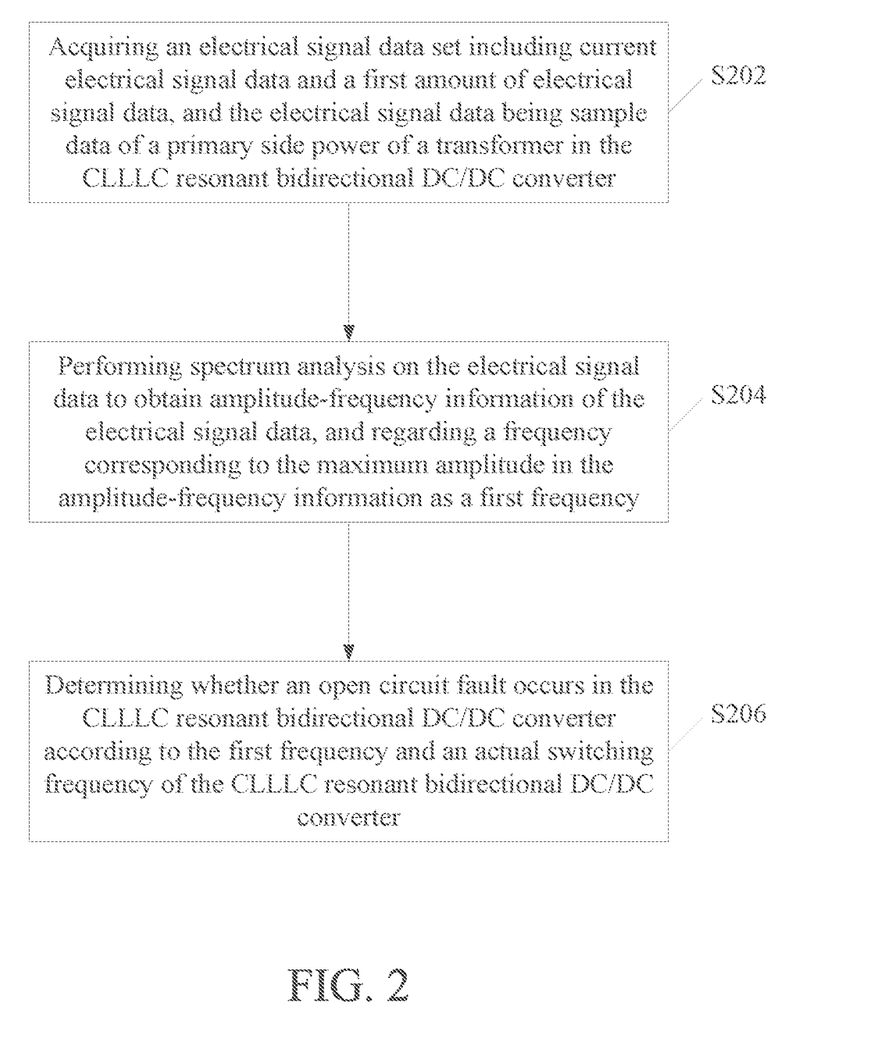
FIG. 2 is a schematic flowchart of an open-circuit fault detection method according to a first embodiment.

In an optional embodiment of the present application, as shown in FIG. 2, an open-circuit fault detection method is provided and adapted to detect an open-circuit fault in the CLLLC resonant bidirectional DC/DC converter shown in FIG. 1. Specifically, the method includes the following steps.

S202, acquiring an electrical signal data set including current electrical signal data and a first amount of electrical signal data, and the electrical signal data being sample data of a primary side power of a transformer in the CLLLC resonant bidirectional DC/DC converter.

Specifically, the electrical signal data set including the current electrical signal data and the first amount of electrical signal data can be obtained by sampling the electrical signal on the primary side of the transformer of the CLLLC resonant bidirectional DC/DC converter.

Optionally, the electrical signal may include a voltage signal and a current signal. In this embodiment of the present application, the electrical signal is a current signal.

It can be understood that the sampling frequency for sampling the electrical signal on the primary side of the transformer of the CLLLC resonant type bidirectional DC/DC converter in this application should satisfy the sampling theorem, that is, open-circuit fault information of the CLLLC resonant type bidirectional DC/DC converter can be obtained according to the sampled electrical signal data. It should be noted that the electrical signal data is the sampling data, so each electrical signal data corresponds to a sampling time. Optionally, the electrical signal data set may be a data linked list. Specifically, the data linked list includes a data field for storing the current electrical signal data and the first amount of electrical signal data, and a pointer field for storing the address of the next node.

It should be explained that, the first amount is not limited in this embodiment, and the first amount may be set according to the required frequency resolution. For example, the first amount is $$L = \frac{f_{sp}}{1000} - 1;$$

wherein, $f_{sp}$ represents a sampling frequency. When the first amount is L, an open circuit fault can be detected and diagnosed in the CLLLC resonant bidirectional DC/DC converter, meanwhile the first amount will not be too large, which brings an overlong diagnosis time.

S204, performing spectrum analysis on the electrical signal data to obtain amplitude-frequency information of the electrical signal data, and regarding a frequency corresponding to the maximum amplitude in the amplitude-frequency information as a first frequency.

It should be explained that, the spectral analysis is for finding out information (such as amplitude, power, intensity or phase, etc.) of a signal at different frequencies. In the present embodiment of the present application, spectrum analysis specifically refers to finding out the corresponding relationship between the frequency and the amplitude of a signal. Specifically, by performing spectrum analysis on the electrical signal data in the electrical signal data set in the above embodiment, the amplitude-frequency information of the electrical signal data can be obtained, and then the amplitude corresponding to the maximum amplitude in the amplitude-frequency information can be obtained accordingly.

Optionally, the method of performing spectrum analysis on the electrical signal data may include performing Fourier transform on the electrical signal data. Specifically, the electrical signal data set is converted from the spatial domain to the frequency domain through Fourier transform to obtain the amplitude-frequency information of the electrical signal data, and then the frequency corresponding to the maximum amplitude in the amplitude-frequency information can be obtained. In an embodiment of the present application, fast Fourier transform may be performed on the electrical signal data. In such a manner, the amount of calculation can be reduced, the amplitude-frequency information can be obtained in real time and then the first frequency can be obtained accordingly. It should be understood that for fast Fourier transform, if the frequency represented by the nth point is:

$f_n = (n-1)*f_{sp}/N,$ wherein, $f_{sp}$ represents a sampling frequency, N represents the number of sampling points, then the frequency that can be distinguished by the fast Fourier transform is $f_{sp}/N$. Therefore, the first amount in the above embodiment is positively related to the resolution of the fast Fourier transform. That is, if the required resolution of the fast Fourier transform is higher, the number of sampling points should be larger.

S206, determining whether an open circuit fault occurs in the CLLLC resonant bidirectional DC/DC converter according to the first frequency and an actual switching frequency of the CLLLC resonant bidirectional DC/DC converter.

It should be noted that, once an open-circuit fault occurs in the CLLLC resonant bidirectional DC/DC converter, the electrical signal will be distorted, resulting in changes of the relationship between the first frequency and the actual switching frequency. Thus, it can be determined whether an open-circuit fault occurs in the CLLLC resonant bidirectional DC/DC converter by analyzing the relationship between the first frequency and the actual switching frequency of the CLLLC resonant bidirectional DC/DC converter.

Figure 3:
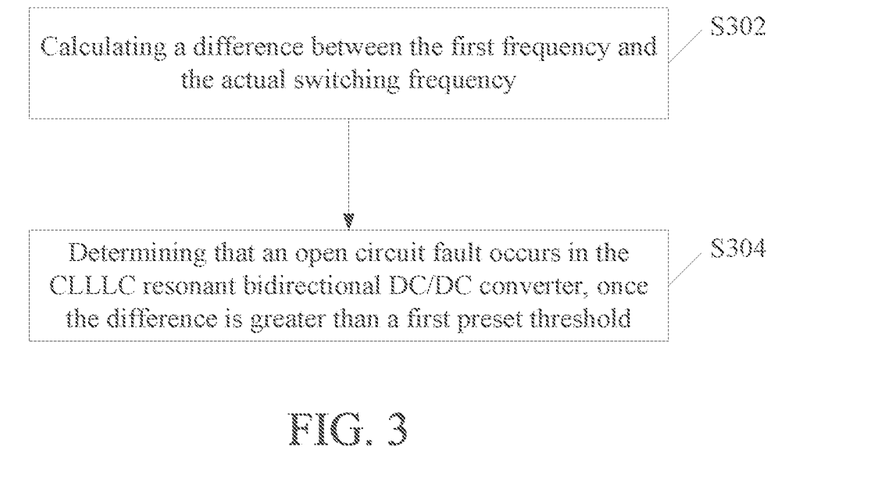
FIG. 3 is a schematic flowchart of a step of "determining whether an open-circuit fault occurs in a CLLLC resonant bidirectional DC/DC converter" according to an embodiment.

As mentioned above, the electrical signal will be distorted in the case of an open-circuit fault, thus an open-circuit fault can be detected and judged according to the first frequency and the actual switching frequency of the CLLLC resonant bidirectional DC/DC converter. Hereinafter, brief descriptions for an exemplary technical process of "determining whether an open-circuit fault occurs in a CLLLC resonant bidirectional DC/DC converter" follow in the embodiment of the present application. Referring to FIG. 3, the above technical process may include the following steps:

S302, calculating a difference between the first frequency and the actual switching frequency.

S304, determining that an open circuit fault occurs in the CLLLC resonant bidirectional DC/DC converter, once the difference is greater than a first preset threshold.

Detailed description of the first frequency may be referred to the above embodiments, which is not repeated here. It should be noted that, the first frequency is equal to the actual switching frequency when the CLLLC resonant bidirectional DC/DC converter has no open-circuit fault; and the first frequency is no longer equal to the actual switching frequency once the CLLLC resonant bidirectional DC/DC converter has an open-circuit fault to cause the electrical signal be distorted. When the circuit is stabilized, the first frequency and the actual switching frequency will be equal again. However, the difference between the obtained first frequency and the actual switching frequency will not be equal, due to circuit instability or calculation error, which does not mean that an open-circuit fault occurs in the CLLLC resonant bidirectional DC/DC converter, in this case. In view of this, a first preset threshold is set in the present embodiment and configured to compare with the difference between the first frequency and the actual switching frequency, in order to improve the accuracy of judging the open circuit fault. It should be explained that the first preset threshold value may be set according to the actual situation. For example, if the error coefficient of the detection device is large, the first preset threshold value should also be increased.

In the open-circuit fault detection method provided by the above embodiment, the first frequency is obtained by performing spectrum analysis on the sampled data of the electrical signal on the primary side of the transformer of the CLLLC resonant bidirectional DC/DC converter, and then an open circuit fault is judged and detected according to the relationship between the first frequency and the actual switching frequency.

Further, no additional sensor is required in the open-circuit fault detection method provided by the above embodiments, which reduces the detection cost, and no impact on the normal operation of the CLLLC resonant bidirectional DC/DC converter is generated, thereby improving the reliability of open-circuit fault detection.

Further, dynamic processes such as voltage and load changes of the CLLLC resonant bidirectional DC/DC converter will not have a negative impact on the detection results of the open-circuit fault detection method provided in the above embodiments, and the open-circuit fault detection method is not sensitive to the internal parameters of the converter, that is, good robustness and strong anti-interference ability are obtained in the open-circuit fault detection method provided by the above embodiment.

The above embodiments provide an open-circuit fault detection method for determining whether an open-circuit fault occurs in a CLLLC resonant bidirectional DC/DC converter. In some situations, it's necessary to determine the location where the open-circuit fault occurs, in order to repair the fault. In view of this, a method that can locate the open-circuit fault in the CLLLC resonant bidirectional DC/DC converter is provided in the following embodiment.

Figure 4:
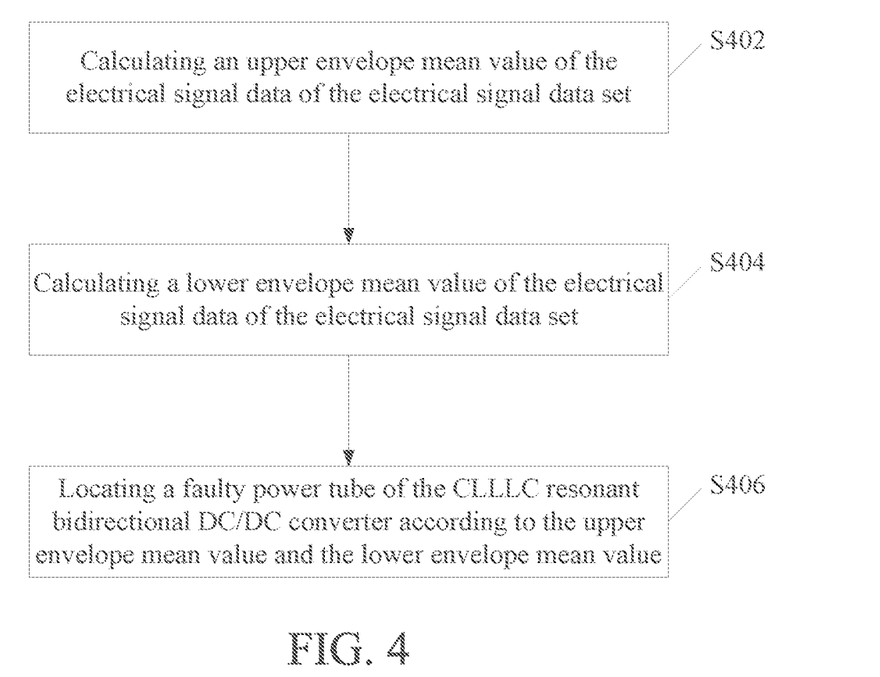
FIG. 4 is a schematic flowchart of an open circuit fault detection method according to a second embodiment.

In an optional embodiment of the present application, as shown in FIG. 4, the open-circuit fault detection method may further include the following steps:

S402, calculating an upper envelope mean value of the electrical signal data of the electrical signal data set.

S404, calculating a lower envelope mean value of the electrical signal data of the electrical signal data set.

S406, locating a faulty power tube of the CLLLC resonant bidirectional DC/DC converter according to the upper envelope mean value and the lower envelope mean value.

Specifically, the upper and lower envelopes of the electrical signal data of the electrical signal data set are constructed, and then the envelope mean values of the upper and lower envelopes are calculated, that is, the upper and lower envelope mean values of the electrical signal data of the electrical signal data set are calculated; depending on the relationship between the upper envelope mean value and the lower envelope mean value, the faulty power tube of the CLLLC resonant bidirectional DC/DC converter can be located.

It should be noted that, the faulty power tube of the CLLLC resonant bidirectional DC/DC converter can be located to detect an open-circuit fault according to the upper envelope mean value and the lower envelope mean value. However, missed diagnosis may occur due to the low degree of distinction. In the open-circuit fault detection method provided in the above embodiments, the degree of distinction becomes higher since it's depended on the first frequency and the actual switching frequency of the CLLLC resonant bidirectional DC/DC converter, so that the accuracy of the detection method is improved. The accuracy of the open-circuit fault detection method is improved. Further, the faulty power tube in the converter can be located according to the relationship between the mean value of the upper envelope and the mean value of the lower envelope, that is to say, the faulty power tube can be located and found out while reducing the occurrence of missed diagnosis.

Referring to FIG. 1, the CLLLC resonant bidirectional DC/DC converter includes a first power unit and a second power unit. Specifically, the first power unit includes power tubes $S_1$ and $S_3$ directly connected to the resonant inductor $L_{r1}$ on the primary side of the CLLLC resonant bidirectional DC/DC converter. Specifically, the second power unit includes power tubes $S_2$ and $S_4$ directly connected to the resonant capacitor $C_{r1}$ on the primary side of the resonant bidirectional DC/DC converter.

Figure 5:
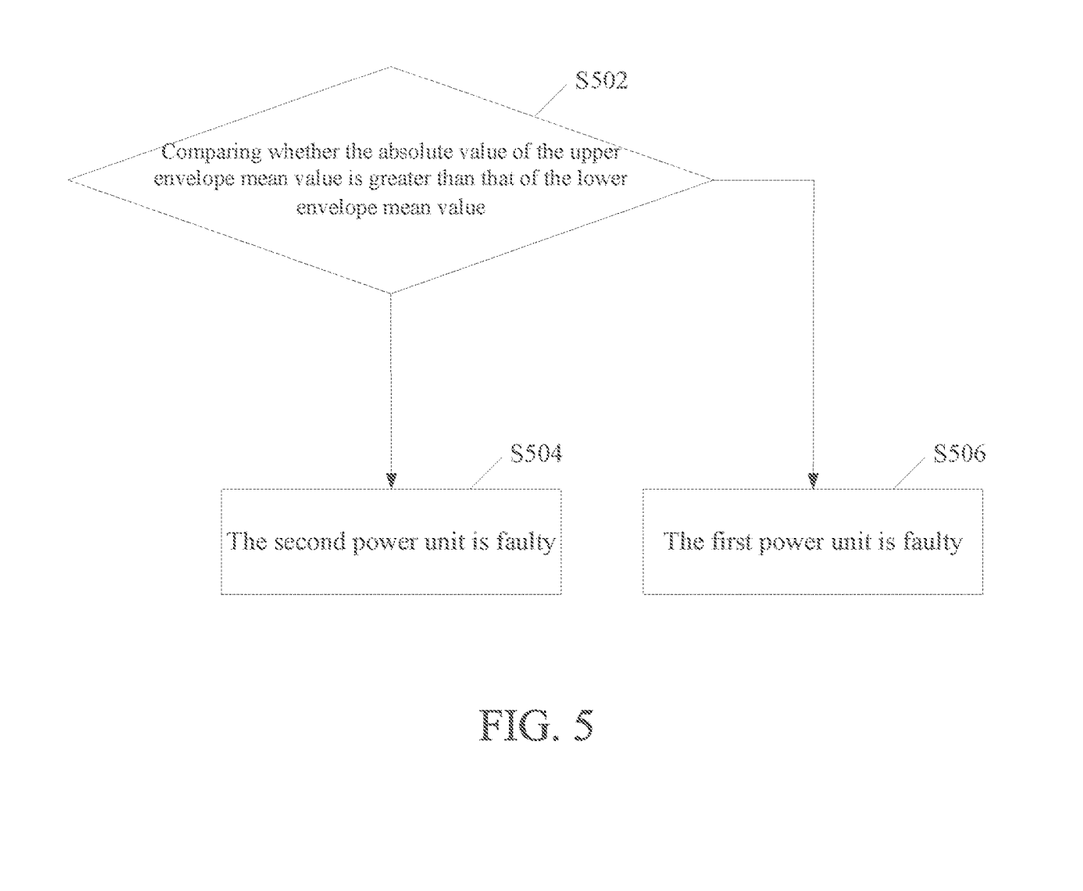
FIG. 5 is a schematic flowchart of the step of "locating the faulty power tube in the CLLLC resonant bidirectional DC/DC converter" according to an embodiment.

In an optional embodiment of the present application, as shown in FIG. 5, an exemplary technical process of "locating a faulty power tube of the CLLLC resonant bidirectional DC/DC converter" is provided. Brief descriptions for the technical process follow. Referring to FIG. 5, the technical process may include the following steps:

S502, comparing whether the absolute value of the upper envelope mean value is greater than that of the lower envelope mean value.

S504, if yes, the second power unit is faulty.

S506, if not, the first power unit is faulty.

Specifically, the method includes comparing the absolute value of the upper envelope mean value with the absolute value of the lower envelope mean value, the second power unit (namely the power tube $S_2$ and/or $S_4$) is determined to be faulty if the absolute value of the upper envelope mean value is greater than that of the lower envelope mean value; and the first power unit (namely the power tube $S_1$ and/or $S_3$) is determined to be faulty if the absolute value of the upper envelope mean value is smaller than that of the lower envelope mean value.

In such a way, it is convenient and quick to locate the faulty power tube, by comparing the absolute value of the upper envelope mean value with the absolute value of the lower envelope mean value.

Since the open-circuit fault in the CLLLC resonant bidirectional DC/DC converter is uncertain, that is, it is impossible to determine when the fault will occur. For detecting the faulty in time to improve the stability of the system, a real-time detection method is provided in the following embodiment.

Figure 6:
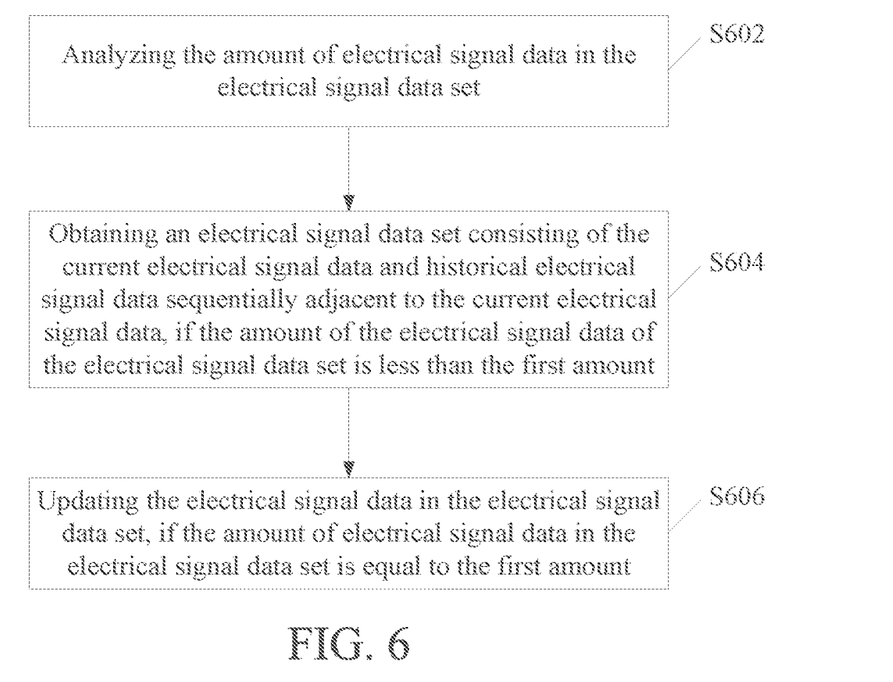
FIG. 6 is a schematic flowchart of the step of "obtaining an electrical signal sampling data set" according to an embodiment.

In an optional embodiment of the present application, as shown in FIG. 6, brief descriptions of an exemplary technical process of "obtaining an electrical signal sampling data set" follow, and the technical process includes the following steps:

S602, analyzing the amount of electrical signal data in the electrical signal data set.

Specifically, the analyzing method includes acquiring the amount of electrical signal data in the electrical signal data set.

S604, obtaining an electrical signal data set consisting of the current electrical signal data and historical electrical signal data sequentially adjacent to the current electrical signal data, if the amount of the electrical signal data of the electrical signal data set is less than the first amount.

Detailed descriptions of the first amount may be referred to the above embodiments, which are not repeated here. It should be noted that, when the amount of electrical signal data in the electrical signal data set is less than the first amount, it may represent that no detection of whether an open circuit fault occurs in the CLLLC resonant bidirectional DC/DC converter was performed before the current moment. In this case, it's necessary to firstly obtain the electrical signal data at the current moment and the historical electrical signal data adjacent to the electrical signal data at the current moment, in order to detect whether an open circuit fault occurs in the CLLLC resonant bidirectional DC/DC converter. It should be noted that, the amount of formed electrical signal data sets should meet the first amount, in order to meet the requirement of resolution.

S606, updating the electrical signal data in the electrical signal data set, if the amount of electrical signal data in the electrical signal data set is equal to the first amount.

It should be noted that, when the amount of electrical signal data in the electrical signal data set is equal to the first amount, it may represent that a detection of whether an open circuit fault occurs in the CLLLC resonant bidirectional DC/DC converter was performed before the current moment. Therefore, it's necessary to update the electrical signal data in the electrical signal data set to obtain an updated electrical signal data set that can reflect whether an open circuit fault occurs in the CLLLC resonant bidirectional DC/DC converter at the current moment, thereby ensuring the real-time detection and the reliability of detection.

Figure 7:
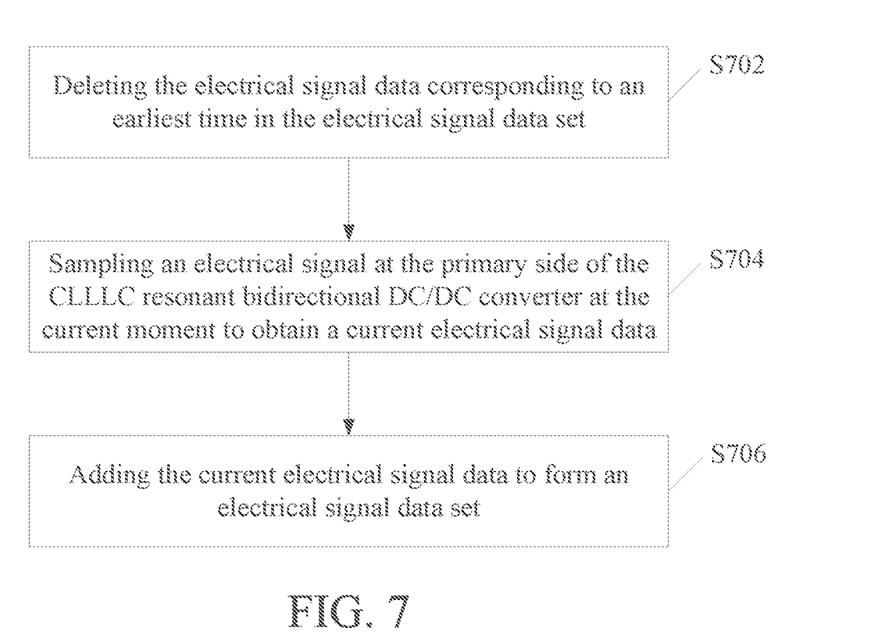
FIG. 7 is a schematic flowchart of the step of "updating the electrical signal data of the electrical signal data set" according to an embodiment.

In an optional embodiment of the present application, brief descriptions for an exemplary technical process of "updating electrical signal data of an electrical signal data set" follow, referring to FIG. 7, the technical process may include the following steps:

S702, deleting the electrical signal data corresponding to an earliest time in the electrical signal data set.

S704, sampling an electrical signal at the primary side of the CLLLC resonant bidirectional DC/DC converter at the current moment to obtain a current electrical signal data.

S706, adding the current electrical signal data to form an electrical signal data set.

It should be noted that, the detailed descriptions of the electrical signal data may be referred to the above embodiments, which are not repeated here. As mentioned above, the electrical signal data is the sampling data, thus the electrical signal data has a corresponding relationship with the time. Specifically, when there is a need to update the electrical signal data in the electrical signal data set, the electrical signal data corresponding to the earliest sampling time in the electrical signal data set should be deleted, and then the electrical signal data at the current moment obtained by sampling the electrical signal at the primary side of the CLLLC resonant bidirectional DC/DC converter at the current moment is added to the electrical signal data set, so that the electrical signal data set is updated.

In such a way, an open-circuit fault detection method capable of updating electrical signal data of an electrical signal data set is provided, thereby realizing real-time detection for the open-circuit fault. Such an open-circuit fault detection method is simple to implement.

Figure 8:
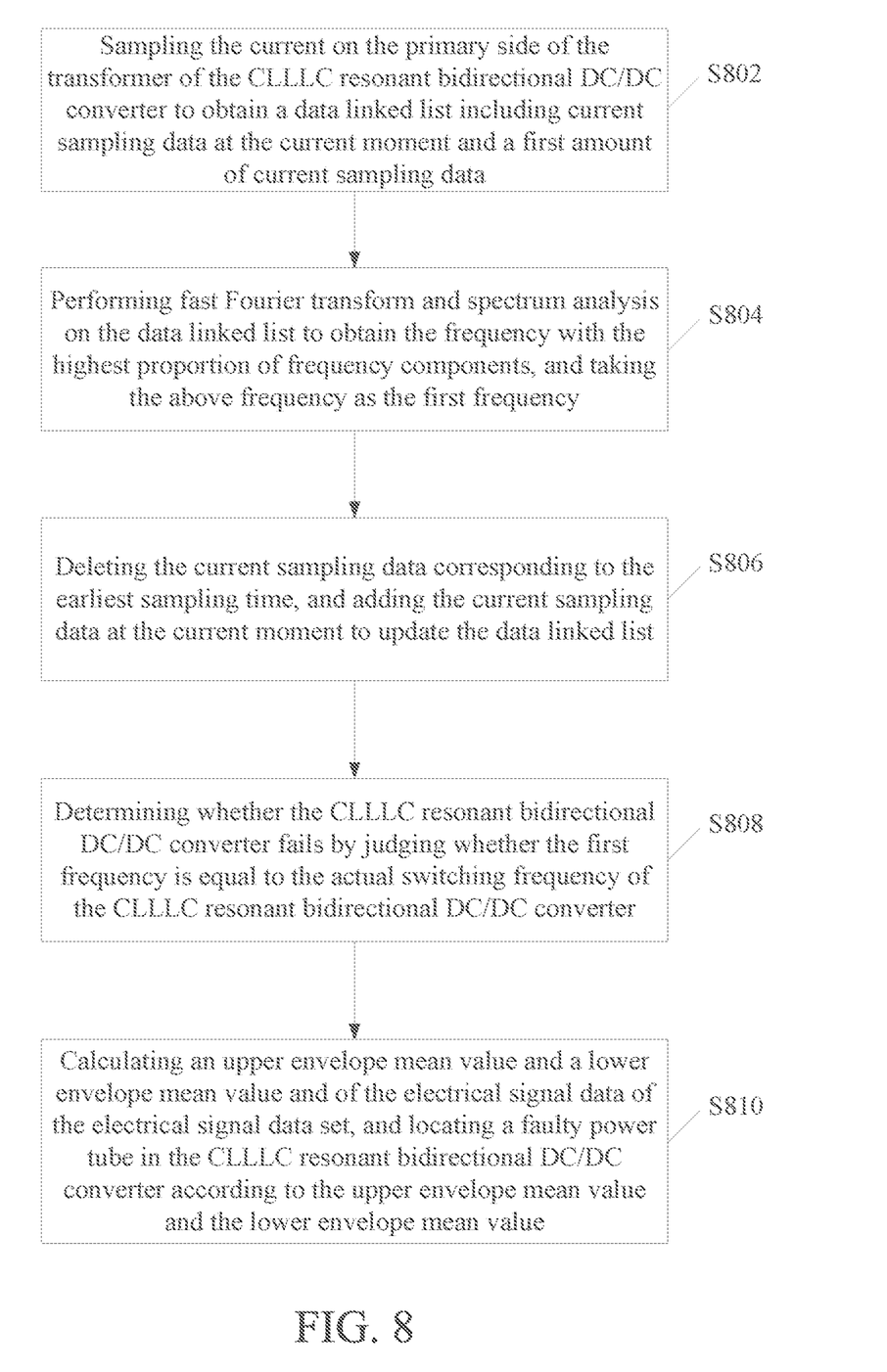
FIG. 8 is a schematic flowchart of an open-circuit fault detection method according to a third embodiment.

In an optional embodiment of the present application, an open-circuit fault detection method is provided for detecting an open-circuit fault in a CLLLC resonant bidirectional DC/DC converter. Referring to FIG. 8, the method may include the following steps:

S802, sampling the current on the primary side of the transformer of the CLLLC resonant bidirectional DC/DC converter to obtain a data linked list including current sampling data at the current moment and a first amount of current sampling data.

Optionally, the first number $$L = \frac{f_{sp}}{1000} - 1,$$

where $f_{sp}$ represents a sampling frequency.

S804, performing fast Fourier transform and spectrum analysis on the data linked list to obtain the frequency with the highest proportion of frequency components, and taking the above frequency as the first frequency.

S806, deleting the current sampling data corresponding to the earliest sampling time, and adding the current sampling data at the current moment to update the data linked list.

S808, determining whether the CLLLC resonant bidirectional DC/DC converter fails by judging whether the first frequency is equal to the actual switching frequency of the CLLLC resonant bidirectional DC/DC converter.

S810, calculating an upper envelope mean value and a lower envelope mean value and of the electrical signal data of the electrical signal data set, and locating a faulty power tube in the CLLLC resonant bidirectional DC/DC converter according to the upper envelope mean value and the lower envelope mean value.

The above embodiment can detect the open-circuit fault in the CLLLC resonant bidirectional DC/DC converter in real time. In such a way, the cost is low, no additional sensor is required, and no impact on the normal circuit operation is generated; further, the robustness is good to have strong anti-interference ability, and the dynamic processes such as the voltage change and load change of the converter will not have a negative impact on the fault diagnosis results of the embodiment; in addition, the open-circuit fault detection method of the embodiment is insensitive to the internal parameters of the system, which has strong anti-disturbance capability, and is simple to implement.

It should be understood that, steps in the flowcharts of FIGS. 2-8 are not necessarily executed in the sequence shown by the arrows. Unless explicitly stated herein, the execution of these steps is not strictly limited to this order, and also may be in other orders. Moreover, at least a part of the steps in FIGS. 2-8 may include multiple steps or multiple stages. These steps or stages are not necessarily executed and completed at the same time, but may be executed at different times. The order of the execution of these steps or stages is also not necessarily sequential, but may be performed alternately with other steps or at least a portion of the steps or phases within the other steps.

Figure 9:
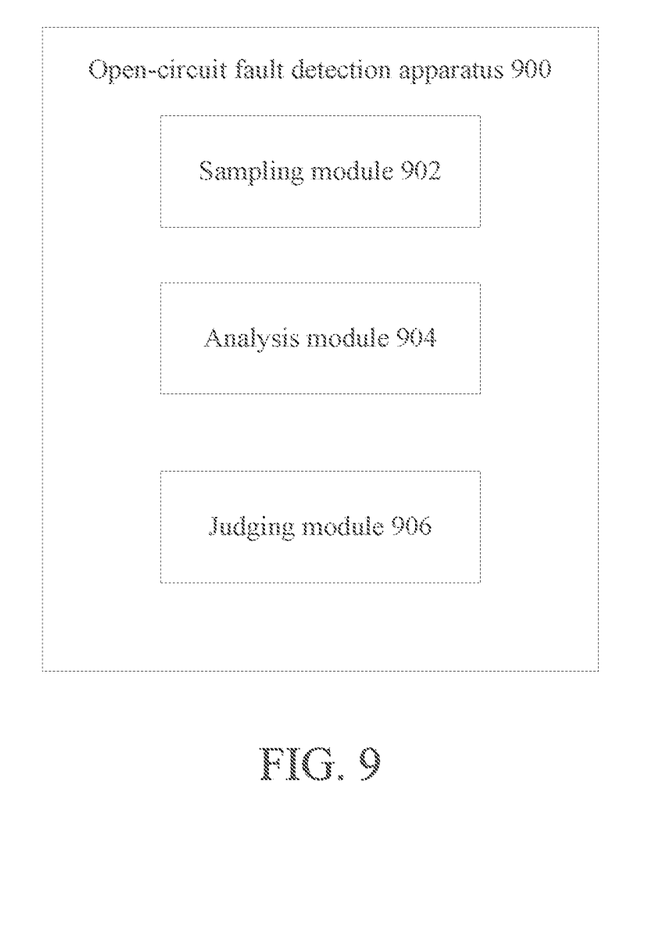
FIG. 9 is a structural block diagram of an open-circuit fault detection apparatus according to an embodiment.

In one embodiment, as shown in FIG. 9, an open-circuit fault detection apparatus 900 suitable to detect an open-circuit fault in a CLLLC resonant bidirectional DC/DC converter is provided, and the apparatus 900 includes a sampling module 902, an analysis module 904 and a judging module 906.

Specifically, the sampling module 902 is configured to obtain an electrical signal data set including current electrical signal data and a first amount of electrical signal data, and the electrical signal data is the sample data of an electrical signal at a primary side of a transformer in the CLLLC resonant bidirectional DC/DC converter.

In an optional embodiment of the present application, the sampling module may also be configured to analyze the amount of electrical signal data in the electrical signal data set, obtain an electrical signal data set consisting of the current electrical signal data and historical electrical signal data sequentially adjacent to the current electrical signal data, if the amount of the electrical signal data of the electrical signal data set is less than the first amount, and update the electrical signal data of the electrical signal data set, if the amount of the electrical signal data of the electrical signal data set is equal to the first amount.

In an optional embodiment of the present application, the sampling module may also be configured to delete the electrical signal data corresponding to an earliest time in the electrical signal data set; sample the electrical signal at the primary side of the CLLLC resonant bidirectional DC/DC converter at the current moment to obtain a current electrical signal data; and add the current electrical signal data to form an electrical signal data set.

The analysis module 904 is configured to perform spectrum analysis on the electrical signal data to obtain amplitude-frequency information of the electrical signal data, and regard a frequency corresponding to the maximum amplitude in the amplitude-frequency information as a first frequency.

In an optional embodiment of the present application, the analysis module may also be configured to perform Fourier transform on the electrical signal data.

The judging module 906 is configured to determine whether an open circuit fault occurs in the CLLLC resonant bidirectional DC/DC converter according to the first frequency and an actual switching frequency of the CLLLC resonant bidirectional DC/DC converter.

In an optional embodiment of the present application, the judging module 906 may also be configured to calculate a difference between the first frequency and the actual switching frequency; and determine that an open circuit fault occurs in the CLLLC resonant bidirectional DC/DC converter, once the difference is greater than a first preset threshold.

In an optional embodiment of the present application, the open-circuit fault detection apparatus provided in the foregoing embodiment may further include a locating module. The locating module can be configured to calculate an upper envelope mean value of the electrical signal data of the electrical signal data set; calculate a lower envelope mean value of the electrical signal data of the electrical signal data set; and locate a faulty power tube in the CLLLC resonant bidirectional DC/DC converter according to the upper envelope mean value and the lower envelope mean value.

Specific limitations on the open-circuit fault detection apparatus may be referred to the above-mentioned limitations on the open-circuit fault detection method, which are not repeated here. All or part of each module in the above-mentioned open-circuit fault detection apparatus can be implemented by software, hardware, or a combination thereof. Said each module can be embedded in or independent of a processor in a computer device in the form of hardware; or stored in a memory in the computer device in the form of software, so that the processor can call and execute the operations corresponding to each module.

In one embodiment, a computer device is also provided, which includes a memory and a processor, wherein the memory is configured to store computer programs, and the processor is configured to execute the computer programs to implement the steps of the open-circuit fault detection method in the foregoing embodiments.

In one embodiment, a computer-readable storage medium is provided, which stores computer programs configured to be executed by a processor to implement the steps of the open-circuit fault detection method in the foregoing embodiments.

Those of ordinary skill in the art can understand that all or part of the processes in the methods of the above embodiments can be implemented by instructing relevant hardware through computer programs which can be stored in a non-volatile computer-readable storage medium. When the computer programs are executed, the processes of the above-mentioned method embodiments may be implemented. Any reference to memory, storage, database or other media used in the various embodiments provided in this application may include at least one of non-volatile and volatile memory. Non-volatile memory may include read-only memory (ROM), magnetic tape, floppy disk, flash memory, or optical memory, and the like. Volatile memory may include random access memory (RAM) or external cache memory. By way of illustration and not limitation, the RAM may be in various forms, such as static random access memory (SRAM) or dynamic random access memory (DRAM).

The technical features in the above embodiments can be combined arbitrarily. For the sake of brevity, all possible combinations of the technical features in the above embodiments are not described, but should be considered to be the range described in this specification as long as there is no contradiction in the combination of these technical features.

The above-mentioned embodiments only represent several embodiments of the present application, and the descriptions thereof are relatively specific and detailed, but should not be construed as limiting the scope of the patent application. It should be pointed out that for those skilled in the art, several modifications and improvements can be made without departing from the concept of the present application, which all belong to the protection scope of the present application. Therefore, the scope of protection of the patent of the present application shall be subject to the appended claims.

What is claimed is:

1. An open-circuit fault detection method, adapted for detecting an open-circuit fault in a CLLLC resonant bidirectional DC/DC converter, and the open-circuit fault detection method being a computer-implemented method and using a computer to perform steps comprising:
    acquiring, by a sampling module, an electrical signal data set including current electrical signal data and a first amount of electrical signal data, and the electrical signal data being sample data of an electrical signal at a primary side of a transformer in the CLLLC resonant bidirectional DC/DC converter;
    performing, by an analysis module, spectrum analysis on the electrical signal data to obtain amplitude-frequency information of the electrical signal data, and regarding a frequency corresponding to a maximum amplitude in the amplitude-frequency information as a first frequency; and
    determining, by a judging module, whether an open circuit fault occurs in the CLLLC resonant bidirectional DC/DC converter according to the first frequency and an actual switching frequency of the CLLLC resonant bidirectional DC/DC converter;
    wherein the c computer-implemented method further uses the judging module to perform steps comprising:
    calculating a difference between the first frequency and the actual switching frequency; and
    determining that an open circuit fault occurs in the CLLLC resonant bidirectional DC/DC converter, once the difference is greater than a first preset threshold.

2. The open-circuit fault detection method as claimed in claim 1, wherein said acquiring an electrical signal data set comprises:
    analyzing an amount of electrical signal data in the electrical signal data set;
    obtaining an electrical signal data set consisting of the current electrical signal data and historical electrical signal data sequentially adjacent to the current electrical signal data, if the amount of the electrical signal data of the electrical signal data set is less than the first amount; and
    updating the electrical signal data in the electrical signal data set, if the amount of the electrical signal data of the electrical signal data set is equal to the first amount.

3. The open-circuit fault detection method as claimed in claim 2, wherein said updating the electrical signal data in the electrical signal data set comprises:
    deleting the electrical signal data corresponding to an earliest time in the electrical signal data set;
    sampling the electrical signal at the primary side of the CLLLC resonant bidirectional DC/DC converter at the current moment to obtain current electrical signal data; and
    adding the current electrical signal data to form an electrical signal data set.

4. The open-circuit fault detection method as claimed in claim 1, further comprising:
    calculating an upper envelope mean value of the electrical signal data of the electrical signal data set;
    calculating a lower envelope mean value of the electrical signal data of the electrical signal data set; and locating a faulty power tube in the CLLLC resonant bidirectional DC/DC converter according to the upper envelope mean value and the lower envelope mean value.

5. The open-circuit fault detection method as claimed in claim 4, wherein the CLLLC resonant bidirectional DC/DC converter comprises a first power unit and a second power unit, and the first power unit comprises a power tube directly connected to an resonant inductor at the primary side of the CLLLC resonant bidirectional DC/DC converter, the second power unit comprises a power tube directly connected to an resonant capacitor at the primary side of the CLLLC resonant bidirectional DC/DC converter;

said locating a faulty power tube of the CLLLC resonant bidirectional DC/DC converter comprises:

determining the second power unit to be faulty, if an absolute value of the mean value of the upper envelope is greater than that of the lower envelope; and determining the first power unit to be faulty, if the absolute value of the mean value of the upper envelope is smaller than that of the lower envelope.

6. The open-circuit fault detection method as claimed in claim 1, wherein said performing spectrum analysis on the electrical signal data comprises performing fast Fourier transform on the electrical signal data.

7. The open-circuit fault detection method as claimed in claim 6, wherein the first amount is positively related to a resolution of the fast Fourier transform.

8. A computer device, comprising a memory and a processor, the memory being stored with computer programs, the processor being configured to execute the computer programs to implement steps of the method according to claim 1.

9. An open-circuit fault detection apparatus, adapted for detecting an open-circuit fault in a CLLLC resonant bidirectional DC/DC converter, and the open-circuit fault detection apparatus comprising:

a sampling module, configured to acquire an electrical signal data set including current electrical signal data and a first amount of electrical signal data, and the electrical signal data being sample data of an electrical signal at a primary side of a transformer in the CLLLC resonant bidirectional DC/DC converter;

an analysis module, configured to perform spectrum analysis on the electrical signal data to obtain amplitude-frequency information of the electrical signal data, and regard a frequency corresponding to a maximum amplitude in the amplitude-frequency information as a first frequency; and a judging module, configured to determine whether an open circuit fault occurs in the CLLLC resonant bidirectional DC/DC converter according to the first frequency and an actual switching frequency of the CLLLC resonant bidirectional DC/DC converter;

wherein the judging module is further configured to perform steps comprising:

calculating a difference between the first frequency and the actual switching frequency; and determining that an open circuit fault occurs in the CLLLC resonant bidirectional DC/DC converter, once the difference is greater than a first preset threshold.

* * * * *